(12) United States Patent
Chen et al.

(10) Patent No.: US 9,812,551 B2
(45) Date of Patent: Nov. 7, 2017

(54) METHOD OF FORMING THE GATE ELECTRODE OF FIELD EFFECT TRANSISTOR

(71) Applicant: TAIWAN SEMICONDUCTOR MANUFACTURING COMPANY, LTD., Hsinchu (TW)

(72) Inventors: Neng-Kuo Chen, Sinshih Township (TW); Clement Hsingjen Wann, Carmel, NY (US); Yi-An Lin, Taipei (TW); Chun-Wei Chang, Taoyuan (TW); Sey-Ping Sun, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/437,962

(22) Filed: Feb. 21, 2017

(65) Prior Publication Data

US 2017/0162669 A1 Jun. 8, 2017

Related U.S. Application Data

(62) Division of application No. 13/572,494, filed on Aug. 10, 2012, now Pat. No. 9,589,803.

(51) Int. Cl.
*H01L 21/336* (2006.01)
*H01L 29/66* (2006.01)
(Continued)

(52) U.S. Cl.
CPC .... *H01L 29/66545* (2013.01); *H01L 21/3212* (2013.01); *H01L 21/32134* (2013.01); *H01L 21/32135* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 5,476,802 A | 12/1995 | Yamazaki et al. | |
| 6,171,910 B1 | 1/2001 | Hobbs et al. | |

(Continued)

FOREIGN PATENT DOCUMENTS

| | | |
|---|---|---|
| CN | 101685800 | 3/2010 |
| TW | 201027749 | 7/2010 |
| TW | 201214572 | 4/2012 |

OTHER PUBLICATIONS

Office Action dated Sep. 8, 2015 from corresponding No. TW 102126417.

(Continued)

*Primary Examiner* — Ali Naraghi
(74) *Attorney, Agent, or Firm* — Hauptman Ham, LLP

(57) ABSTRACT

This description relates to a method of forming the gate electrode of a semiconductor device, the method including providing a substrate comprising a dummy gate electrode (DGE), a source/drain (S/D) region, a spacer on a dummy gate sidewall, and an isolation feature, depositing a contact etch stop layer (CESL) over the DGE, the S/D region and the spacer, depositing an interlayer dielectric (ILD) layer over the CESL, performing a first chemical mechanical polishing (CMP) to expose the CESL over the DGE, performing a second CMP to expose the DGE, removing an upper portion of the CESL and the spacer, and performing a third CMP to expose the CESL over the S/D region to produce a structure in which an entire top surface of the CESL over the S/D region and isolation feature is substantially co-planar with a top surface of the DGE.

20 Claims, 14 Drawing Sheets

(51) Int. Cl.
  *H01L 21/3213*  (2006.01)
  *H01L 21/321*  (2006.01)

(56) References Cited

U.S. PATENT DOCUMENTS

| | | |
|---|---|---|
| 6,413,802 B1 | 7/2002 | Hu et al. |
| 7,166,506 B2 | 1/2007 | Prince et al. |
| 8,143,668 B2 | 3/2012 | Morita et al. |
| 8,153,526 B2 | 4/2012 | Lee et al. |
| 8,310,011 B2 | 11/2012 | Salman et al. |
| 8,338,245 B2 | 12/2012 | Lee et al. |
| 8,445,939 B2 | 5/2013 | Grant |
| 8,836,049 B2 | 9/2014 | Tsai |
| 2004/0183111 A1 | 9/2004 | Shinkawata |
| 2006/0046523 A1 | 3/2006 | Kavalieros et al. |
| 2009/0311857 A1 | 12/2009 | Todd et al. |
| 2010/0081262 A1 | 4/2010 | Lim et al. |
| 2011/0316095 A1 | 12/2011 | Shimizu |
| 2012/0052647 A1 | 3/2012 | Kim |
| 2012/0161240 A1 | 6/2012 | Kronholz et al. |
| 2012/0211844 A1* | 8/2012 | Schloesser ...... H01L 21/823412 257/410 |
| 2012/0217590 A1 | 8/2012 | Babich et al. |
| 2012/0256276 A1 | 10/2012 | Hwang |
| 2012/0270379 A1* | 10/2012 | Lai .................. H01L 21/31053 438/401 |
| 2013/0234252 A1 | 9/2013 | Lee et al. |
| 2014/0015104 A1* | 1/2014 | Su ........................ H01L 21/225 257/611 |

OTHER PUBLICATIONS

Notice of Allowance dated Oct. 28, 2014 and English Translation from corresponding No. KR 10-2013-0003811.
Office Action dated Jan. 14, 2014 and English translation from corresponding application No. KR 10-2013-0003811.
Office Action dated Jan. 28, 2015 from corresponding No. TW 102126417.

* cited by examiner

METHOD OF FORMING THE GATE ELECTRODE OF FIELD EFFECT TRANSISTOR

PRIORITY CLAIM

The present application is a divisional of U.S. application Ser. No. 13/572,494, filed Aug. 10, 2012, which is incorporated herein by reference in its entirety.

TECHNICAL FIELD

This disclosure relates to integrated circuit fabrication, and more particularly to a field effect transistor with a gate electrode.

BACKGROUND

As technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide having a low-dielectric-constant used in larger technology nodes.

However, there are challenges to implementing such features and processes in complementary metal-oxide-semiconductor (CMOS) fabrication. For example, in a "gate last" fabrication process, achieving a low gate resistance for a field effect transistor (FET) is difficult because voids are generated in the metal gate electrode after metal layer deposition for gap filling of a high-aspect-ratio trench, thereby increasing the likelihood of device instability and/or device failure. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples based on a "gate last" metal gate structure, however, one skilled in the art may recognize applicability to other structures and/or use of other materials.

Figure 1:
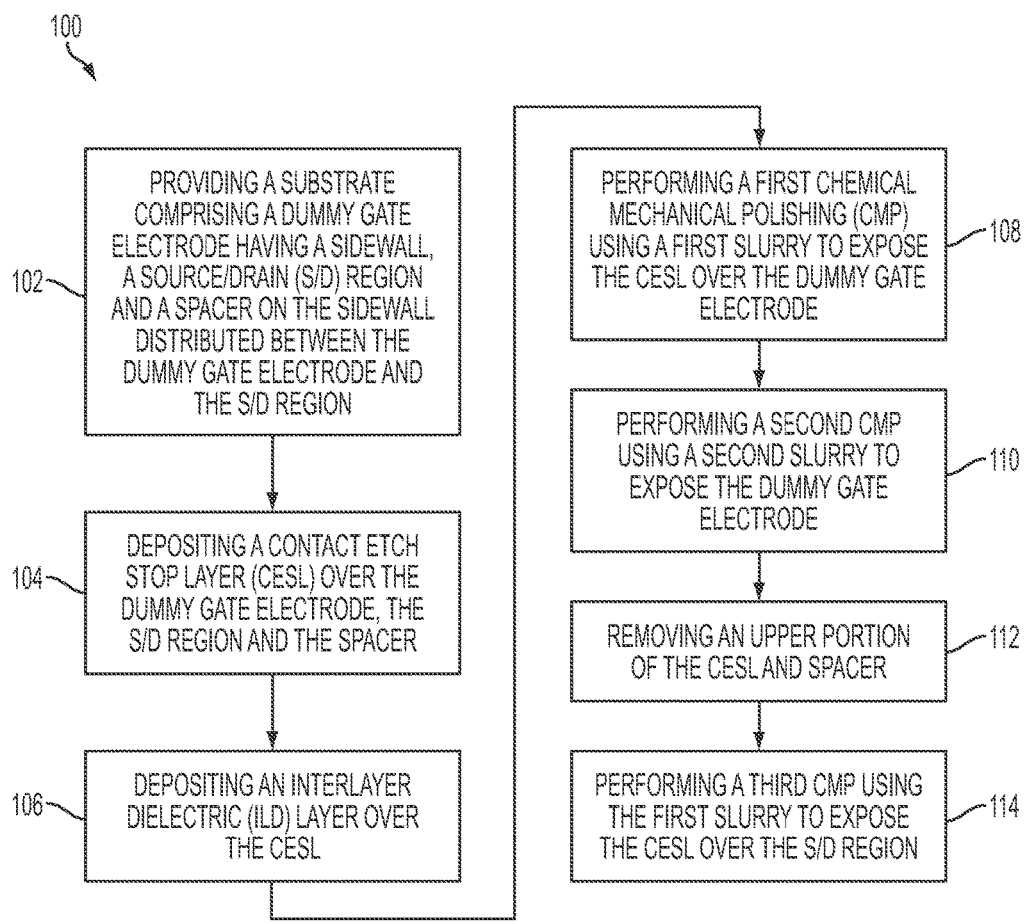
FIG. 1 is a flowchart of a method of fabricating a field effect transistor comprising a gate electrode according to various aspects of the present disclosure.

Referring to FIG. 1, illustrated is a flowchart illustrating a method 100 of fabricating a field effect transistor comprising a gate electrode according to various aspects of the present disclosure. The method 100 begins with step 102 in which a substrate is provided, wherein the substrate comprises a dummy gate electrode having a sidewall, a source/drain (S/D) region and a spacer on the sidewall distributed between the dummy gate electrode and the S/D region. The method 100 continues with step 104 in which a contact etch stop layer (CESL) is deposited over the dummy gate electrode, the S/D region and the spacer. The method 100 continues with step 106 in which an interlayer dielectric (ILD) layer is deposited over the CESL. The method 100 continues with step 108 in which a first chemical mechanical polishing (CMP) using a first slurry is performed to expose the CESL over the dummy gate electrode. The method 100 continues with step 110 in which a second CMP using a second slurry is performed to expose the dummy gate electrode. The method 100 continues with step 112 in which an upper portion of the CESL and spacer is removed. The method 100 continues with step 114 in which a third CMP using the first slurry is performed to expose the CESL over the S/D region. The discussion that follows illustrates embodiments of a field effect transistor (FET) that can be fabricated according to the method 100 of FIG. 1.

FIGS. 2-12 are schematic cross-sectional views of a gate electrode 224 of a field effect transistor (FET) 200 at various stages of fabrication according to various aspects of present disclosure. In some embodiments, the FET 200 is a planar field effect transistor. In some embodiments, the FET 200 is a Fin field effect transistor. The FET 200 may be included in a microprocessor, a memory cell, and/or other integrated circuits (IC). In some embodiments, the performance of the operations mentioned in FIG. 1 does not produce a completed FET 200. A completed FET 200 may be fabricated using complementary metal-oxide-semiconductor (CMOS) technology processing. Accordingly, additional processes may be provided before, during, and/or after the method 100 of FIG. 1, and that some other processes may only be briefly described herein. Also, FIGS. 2 through 12 are simplified for a better understanding of the concepts of the present disclosure. For example, although the figures illustrate the FET 200, the IC may comprise a number of other devices comprising resistors, capacitors, inductors, fuses, etc.

Figure 2:
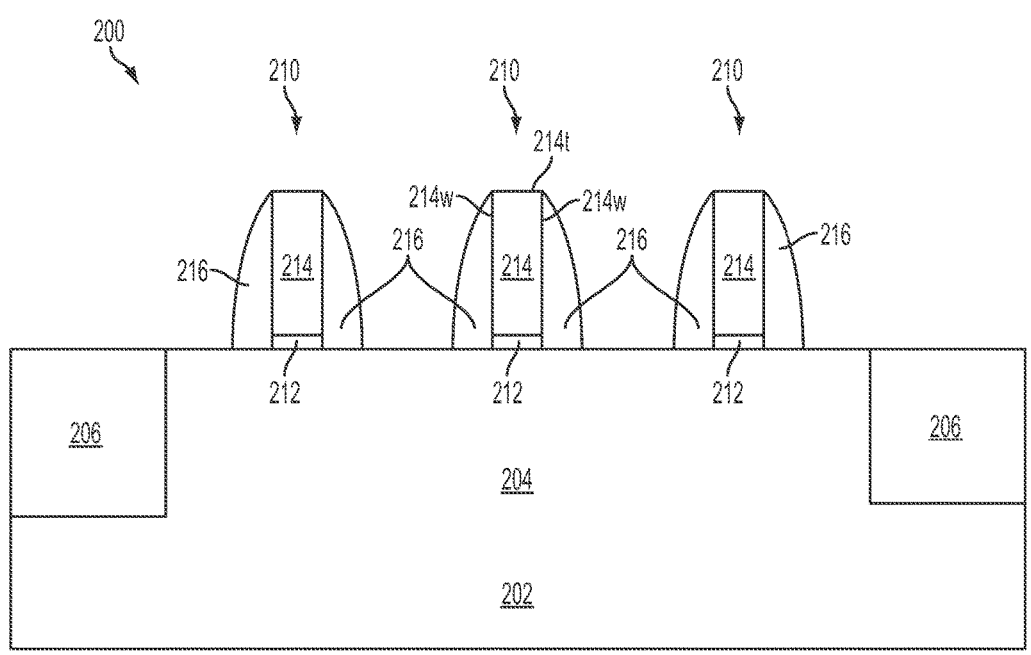
FIGS. 2-13 are cross-sectional views of a gate electrode of a field effect transistor at various stages of fabrication according to various aspects of the present disclosure.

Referring to FIG. 2 and step 102, a substrate 202 is provided. In at least one embodiment, the substrate 202 comprises a crystalline silicon substrate (e.g., wafer). In some alternative embodiments, the substrate 202 is made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

The substrate 202 may further comprise active regions 204 (for simplicity only shown one active region) and isolation regions 206. The active regions 204 may include various doping configurations depending on design requirements. In some embodiments, the active region 204 is doped with p-type or n-type dopants. For example, the active regions 204 may be doped with p-type dopants, such as boron or $BF_2$; n-type dopants, such as phosphorus or arsenic; and/or combinations thereof. The active regions 204 may act as regions configured for an n-type metal-oxide-semiconductor FET (referred to as nMOSFET), or alternatively configured for a p-type MOSFET (referred to as pMOSFET).

The isolation regions 206 may be formed on the substrate 202 to isolate the various active regions 204. The isolation regions 206 may utilize isolation technology, such as local oxidation of silicon (LOCOS) or shallow trench isolation (STI), to define and electrically isolate the various active regions 204. In the depicted embodiment, the isolation region 206 includes a STI. The isolation regions 206 may comprise silicon oxide, silicon nitride, silicon oxynitride, fluoride-doped silicate glass (FSG), a low-K dielectric material, other suitable materials, and/or combinations thereof. The isolation regions 206, and in the depicted embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Then, a gate dielectric layer 212 is formed over the substrate 202. In some embodiments, the gate dielectric layer 212 may comprise silicon oxide, a high-k dielectric material or a combination thereof. A high-k dielectric material is defined as a dielectric material with a dielectric constant greater than that of $SiO_2$. The high-k dielectric layer comprises metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer 212 may be grown by a thermal oxidation process, a chemical vapor deposition (CVD) process, an atomic layer deposition (ALD) process, and may have a thickness less than 2 nanometers (nm).

Figure 13:
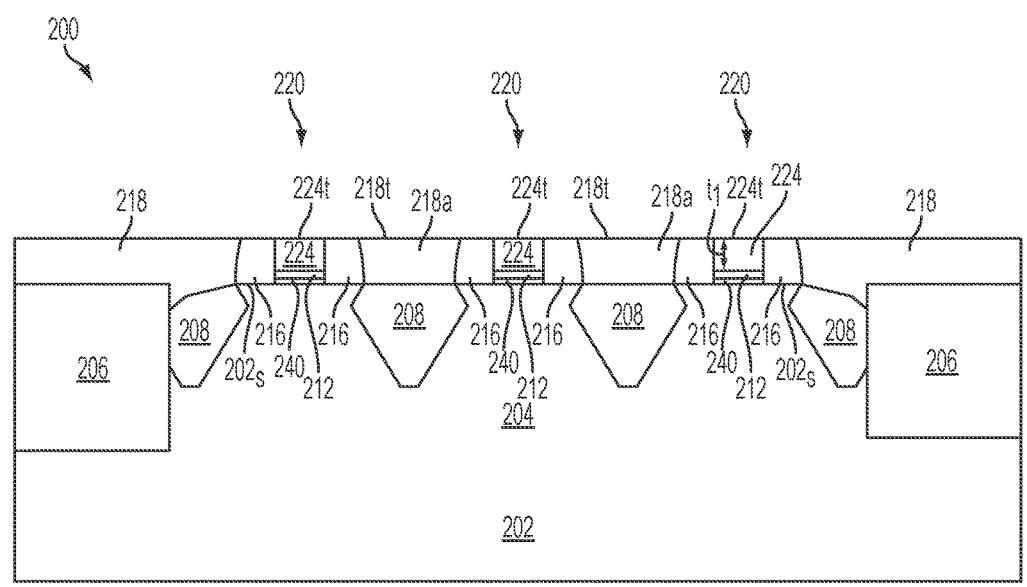

The gate dielectric layer 212 may further comprise an interfacial layer 240 (FIG. 13) to minimize stress between the gate dielectric layer 212 and the substrate 202. The interfacial layer may be formed of silicon oxide or silicon oxynitride grown by a thermal oxidation process. For example, the interfacial layer can be grown by a rapid thermal oxidation (RTO) process or in an annealing process comprising oxygen.

Then, a dummy gate electrode 214 may be formed over the gate dielectric layer 212. In some embodiments, the dummy gate electrode 214 may comprise a single layer or a multilayer structure. In the depicted embodiment, the dummy gate electrode 214 may comprise poly-silicon. Further, the dummy gate electrode 214 may be doped poly-silicon with uniform or gradient doping. The dummy gate electrode 214 may have any suitable thickness. In the depicted embodiment, the dummy gate electrode 214 has a thickness in the range of about 30 nm to about 60 nm. The dummy gate electrode 214 may be formed using a low-pressure chemical vapor deposition (LPCVD) process.

Then, the dummy gate electrode 214 and gate dielectric layer 212 are patterned to produce the structure shown in FIG. 2. A layer of photoresist (not shown) is formed over the dummy gate electrode 214 by a suitable process, such as spin-on coating, and patterned to form a patterned photoresist feature over the dummy gate electrode 214 by a proper lithography patterning method. A width of the patterned photoresist feature is in the range of about 10 nm to 45 nm. The patterned photoresist feature can then be transferred using a dry etching process to the underlying layers (i.e., the dummy gate electrode 214 and the gate dielectric layer 212) to form a plurality of the dummy gate stacks 210. The dummy gate electrode 214 comprises a top surface 214*t* and sidewalls 214*w*. The photoresist layer may be stripped thereafter.

A conformal spacer material is then deposited around the gate stacks 210. In the present embodiment, the spacer material may include silicon nitride, silicon oxy-nitride, silicon carbide, or carbon-doped silicon nitride or other suitable material. The spacer material may comprise a single layer or multilayer structure. A blanket layer of the spacer material may be formed by CVD, ALD, physical vapor deposition (PVD), or other suitable technique. The blanket layer has a thickness ranging from about 5 nm to 15 nm. Then, an anisotropic etching is performed on the spacer material to form a pair of spacers 216 on sidewalls 214*w* of the dummy gate electrode 214.

Figure 3:
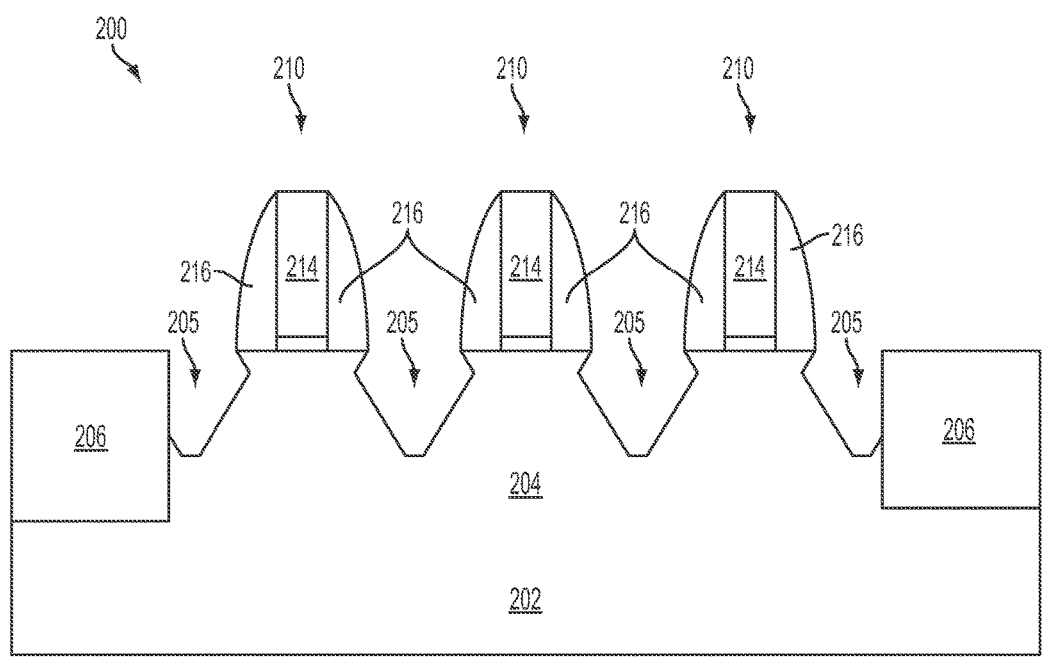

Then, using the gate stacks 210 and the pair of spacers 216 as hard masks, a biased etching process is performed to recess the substrate 202 that are unprotected or exposed to form the source/drain (S/D) cavities 205 in the active region 204 (shown in FIG. 3). In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$.

Figure 4:
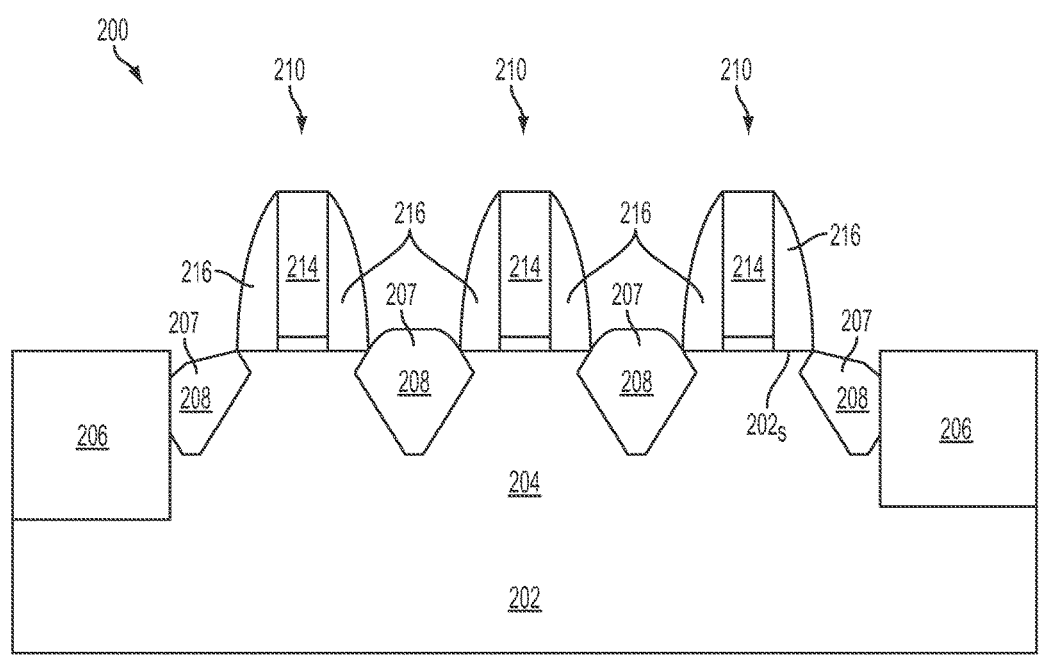

Referring to FIG. 4 and step 102 in FIG. 1, subsequent to the formation of the S/D cavities 205 in the active region 204, the structure in FIG. 4 is produced by epi-growing a strained material 207 in the S/D cavities 205 to form S/D regions 208, wherein a lattice constant of the strained material 207 is different from a lattice constant of the substrate 202. In other words, each of the S/D regions 208 is at least partially disposed in the substrate 202 on one side of the dummy gate electrode 214. In some embodiments, the S/D region 208 extends above a substrate surface 202*s*. In some embodiments, the S/D region 208 is entirely below the substrate surface 202*s* (not shown).

In some embodiments, the strained material 207 comprises SiC or SiP for an nMOSFET. The strained material 207 such as SiC is selectively grown by a low-pressure CVD (LPCVD) process to form the S/D regions 208. In the depicted embodiment, the LPCVD process is performed at a temperature of about 400° C. to 800° C. and under a pressure of about 1 Torr to 15 Torr, using $SiH_4$, $CH_4$, and $H_2$ as reaction gases.

In some embodiments, the strained material 207 comprises SiGe or SiGeB for a pMOSFET. The strained material 207 such as silicon germanium (SiGe) is selectively grown by an LPCVD process to form the S/D regions 208. In one embodiment, the LPCVD process is performed at a temperature of about 660° C. to 700° C. and under a pressure of about 13 Torr to 50 Torr, using $SiH_2Cl_2$, HCl, $GeH_4$, $B_2H_6$, and $H_2$ as reaction gases.

In some embodiment, silicide regions (not shown) may be optionally formed on the S/D regions 208 by a self-aligned silicide (salicide) process. For example, the salicide process may comprise 2 steps. First, a metal material may be deposited via sputtering on the S/D regions 208 at a temperature between about 500° C. to about 900° C., causing a reaction between the underlying silicon and metal material to form the silicide regions. Then, the un-reacted metal material may be etched away. The silicide regions may comprise a material selected from titanium silicide, cobalt silicide, nickel silicide, platinum silicide, erbium silicide, and palladium silicide.

Figure 5:
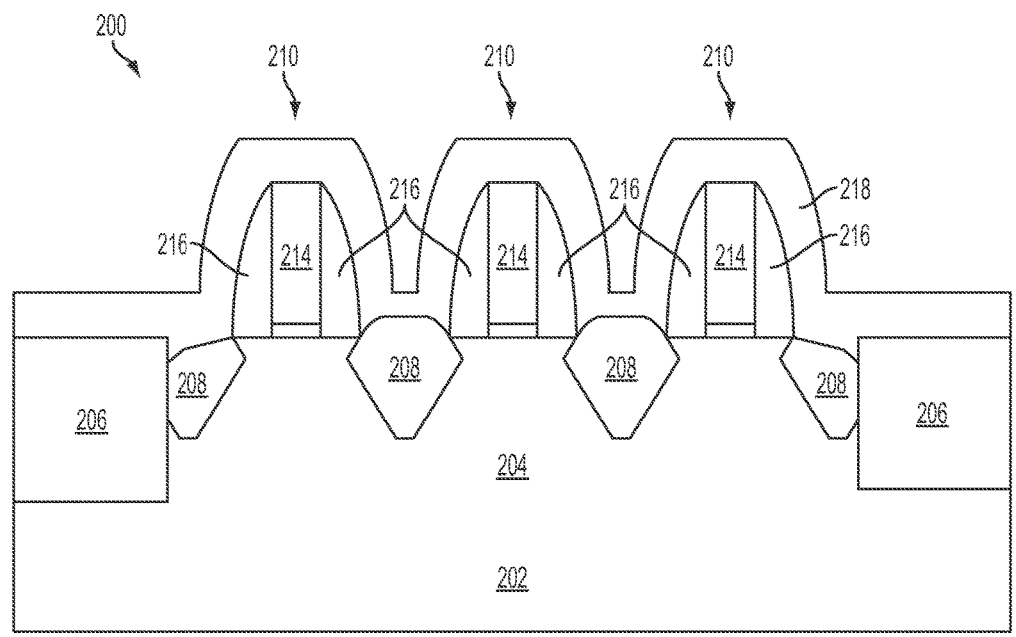

Referring to FIG. 5 and step 104 in FIG. 1, following the formation of the S/D regions 208 in the active region 204, the structure in FIG. 5 is produced by depositing a contact etch stop layer (CESL) 218 over the dummy gate electrode 214, the S/D region 208 and the spacer 216 and extending along the STI regions 206. The CESL 218 may comprise, but is not limited to, silicon nitride, silicon oxy-nitride, silicon carbide, or carbon-doped silicon nitride. The CESL 218 has a thickness in the range of about 15 nm to about 20 nm.

In some embodiments, the CESL 218 may be deposited using CVD, high density plasma (HDP) CVD, sub-atmospheric CVD (SACVD), molecular layer deposition (MLD), sputtering, or other suitable methods. For example, the MLD process of the depicted embodiment is carried out under a pressure less than 10 mTorr and in a temperature range from about 350° C. to 500° C. In at least one embodiment, the silicon nitride is deposited over the gate electrode 214, the S/D region 208 and the spacer 216 by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In another embodiment, the carbon-doped silicon nitride is deposited over the gate electrode 214, the S/D region 208 and the spacer 216 by reacting a carbon source compound, a silicon source compound, and a nitrogen source. The carbon source compound may be an organic compound, such as a hydrocarbon compound, e.g., ethylene ($C_2H_6$), and the silicon source compound and the nitrogen source may be the same as for the silicon nitride CESL.

Figure 6:
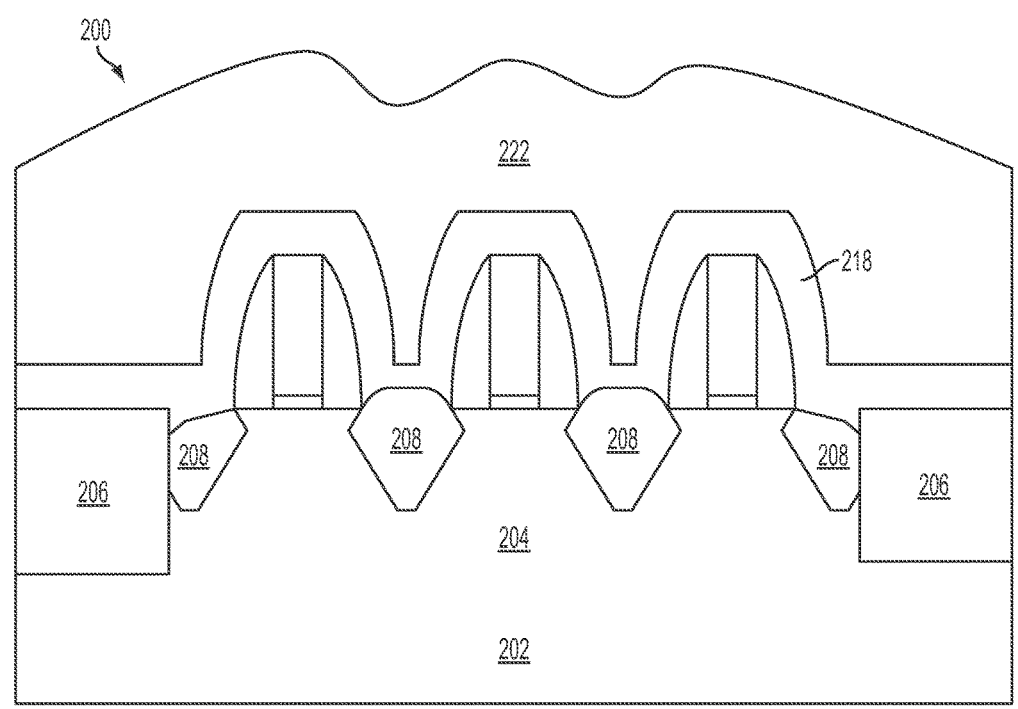

Referring to FIG. 6 and step 106 in FIG. 1, after depositing the CESL 218, the structure in FIG. 6 is produced by depositing an interlayer dielectric (ILD) layer 222 over the CESL 218. The ILD layer 222 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK® (Dow Chemical, Midland, Mich.), polyimide, and/or combinations thereof. The ILD layer 222 may comprise one or more dielectric materials and/or one or more dielectric layers. In some embodiments, the ILD layer 222 may be deposited over the CESL 218 to a suitable thickness by CVD, high density plasma (HDP) CVD, sub-atmospheric CVD (SACVD), spin-on, sputtering, or other suitable methods. In the depicted embodiment, the ILD layer 222 comprises a thickness of about 3000 Angstroms (Å) to 4500 Å.

In a gate last process, the dummy gate electrode 214 may be removed so that a resulting metal gate electrode 224 (shown in FIG. 12) may be formed in place of the dummy gate electrode 214. Accordingly, both the ILD layer 222 and the CESL 218 are planarized using CMP processes (steps 108, 110 in FIG. 1) until the top surface 214t of the dummy gate electrode layer 214 is exposed or reached.

Figure 7:
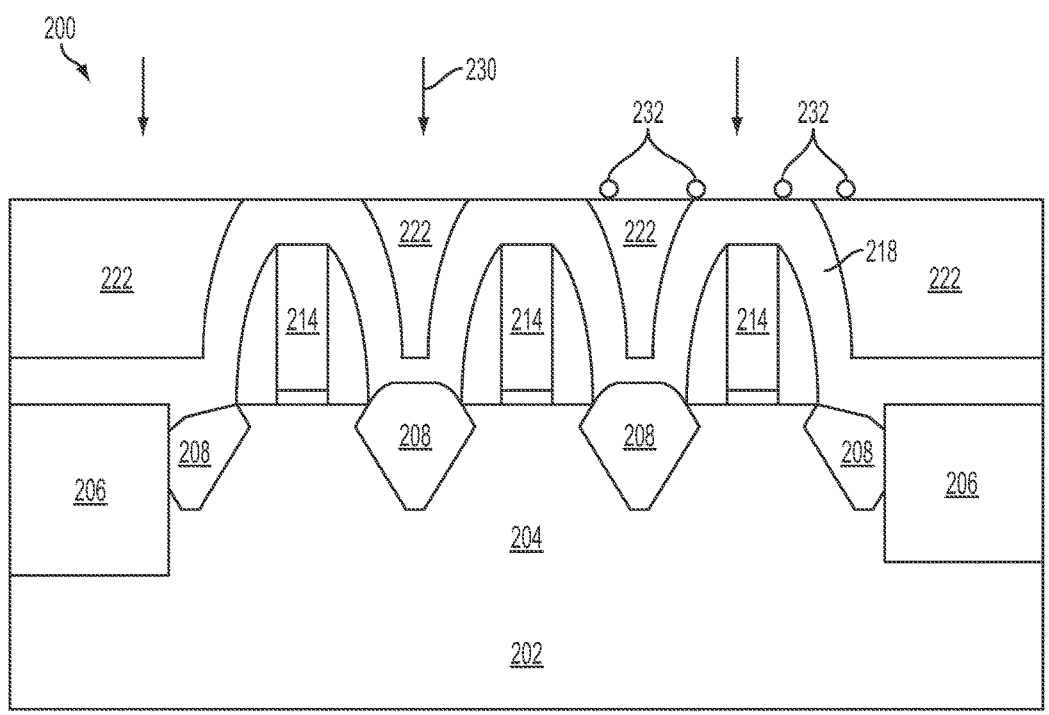

Referring to FIG. 7 and step 108 in FIG. 1, after depositing the ILD layer 222 over the CESL 218, the structure in FIG. 7 is produced by performing a first chemical mechanical polishing (CMP) 230 using a first slurry 232 to expose the CESL 218 over the dummy gate electrode 214. In the depicted embodiment, the first CMP 230 is performed at a head rotation speed of about 50 rpm to about 150 rpm and a platen rotation speed of about 50 rpm to about 150 rpm, and under a down force of about 1 psi to about 4 psi and a slurry flow rate of about 100 mL per minute to about 300 mL per minute. In some embodiments, the first slurry 232 comprises $CeO_2$.

Figure 8:
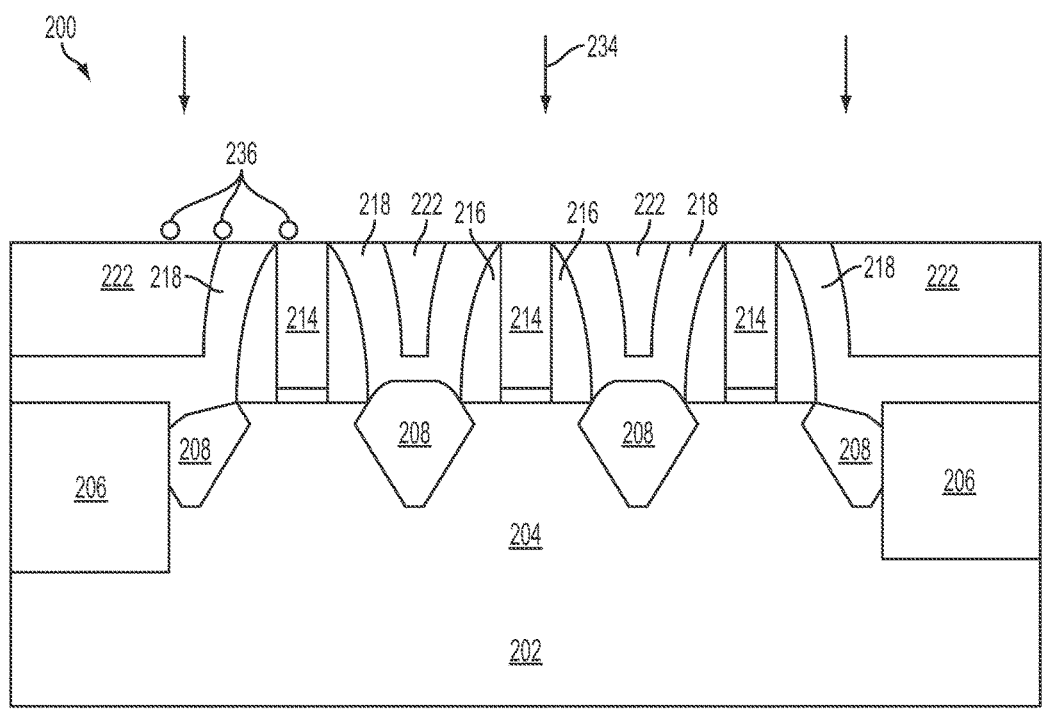

Referring to FIG. 8 and step 110 in FIG. 1, subsequent to the first CMP 230 to expose the CESL 218, the structure in FIG. 8 is produced by performing a second CMP 234 using a second slurry 236 to expose the dummy gate electrode 214. In the depicted embodiment, the second CMP 236 is performed at a head rotation speed of about 50 rpm to about 150 rpm and a platen rotation speed of about 50 rpm to about 150 rpm, and under a down force of about 1 psi to about 4 psi and a slurry flow rate of about 100 mL per minute to about 300 mL per minute. In some embodiments, the second slurry 236 comprises $SiO_2$. Thus, the second CMP 234 may have a high selectivity to provide a substantially planar surface for the dummy gate electrode 214, spacers 216, CESL 218, and ILD layer 222.

In some embodiments, after the CMP processes, a gate replacement process is performed. The dummy gate electrode 214 may be removed from the gate stacks 210 surrounded with dielectric comprising the spacers 216, CESL 218, and ILD layer 222, which results in the formation of a high-aspect-ratio (e.g., greater than 3) trench in the dielectric by a wet etch and/or a dry etch process.

A metal layer then fills in the high-aspect-ratio trench. The metal layer may include any metal material suitable for forming a metal gate electrode or portion thereof, including barriers, work function layers, liner layers, interface layers, seed layers, adhesion layers, barrier layers, etc. The metal layer is formed by a PVD process.

A side effect of the PVD process is especially prone to formation of a metal overhang at a mouth of the high-aspect-ratio trench; thereby the metal overhang tends to block the mouth of the high-aspect-ratio trench. Even if this metal overhang does not actually pinch off and close the high-aspect-ratio trench, it will at least reduce a diameter of the mouth of the high-aspect-ratio trench and consequently impede further metal material from entering into the high-aspect-ratio trench and generate voids in the high-aspect-ratio trench, thereby increasing the likelihood of device instability and/or device failure.

Accordingly, the processing discussed below with reference to FIGS. 9-12 may remove at least a portion of the dummy gate electrode 214 to generate a low-aspect-ratio trench to make further depositions into the low-aspect-ratio trench easier than in a high-aspect-ratio trench. This can reduce void generation in a metal gate electrode in the low-aspect-ratio trench and improve device performance.

Figure 9:
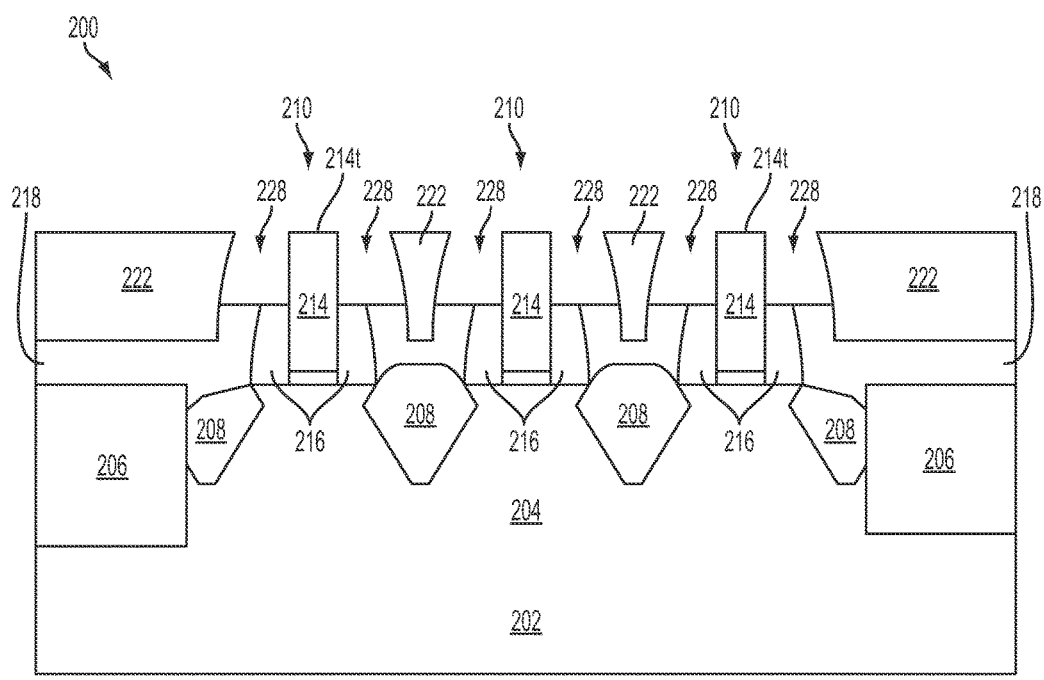

As depicted in FIG. 9 and step 112 in FIG. 1, for fabricating a low-aspect-ratio metal gate electrode (such as a metal gate electrode 224 shown in FIG. 12) of the FET 200, the structure in FIG. 9 is produced by removing an upper portion of the CESL 218 and spacers 216. Using the gate stack 210 and the ILD layer 222 as hard masks, a wet and/or a dry etch process is performed to recess the upper portion of the CESL 218 and spacers 216 that are unprotected or exposed to form cavities 228 lower than the top surface 214t. In some embodiments, the wet etch process for silicon nitride CESL 218 and silicon nitride spacers 216 includes exposure to a solution containing hot $H_3PO_4$. In some embodiments, the dry etch process may be performed at a temperature of about 10° C. to about 70° C., under a source power of about 300 W to about 1000 W and a bias power of about 50 W to about 300 W, and under a pressure of about 10 mTorr to about 100 mTorr, using a reaction gas comprises $CH_3F$.

Figure 10:
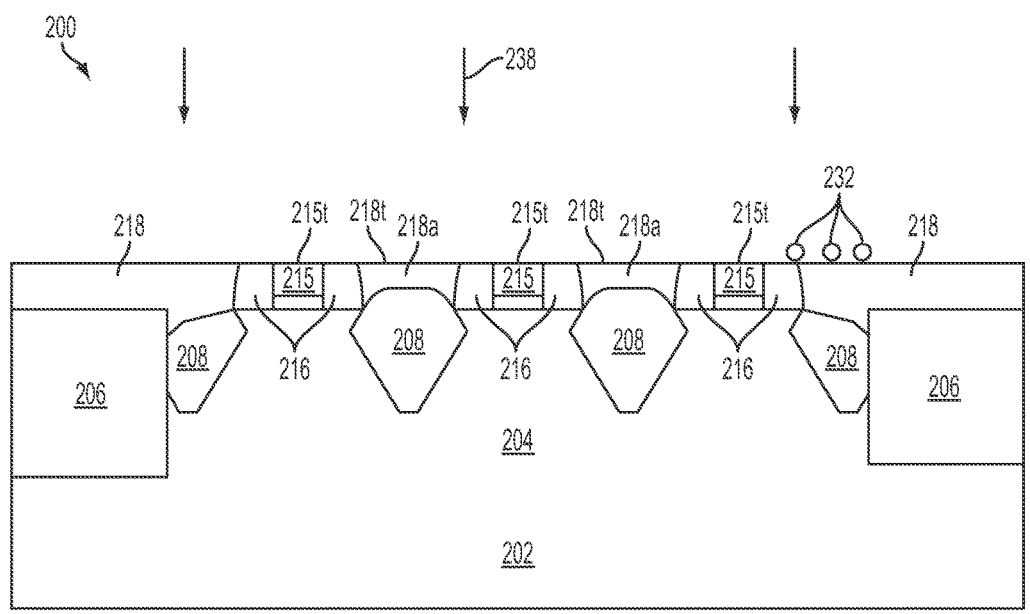

Referring to FIG. 10 and step 114 in FIG. 1, after removing an upper portion of the CESL 218 and spacers 216, the structure in FIG. 10 is produced by performing a third CMP 238 using the first slurry 232 to expose the CESL 218 over the S/D region 208, wherein the CESL 218 is adjacent to the spacer 216 and further comprising a portion 218a extending over the S/D region 208, wherein the portion 218a has a second top surface 218t substantially coplanar with a first top surface 215t of a remaining dummy gate electrode 215. The remaining dummy gate electrode 215 having a low-aspect-ratio (from about 0.8 to about 1.2). In the depicted embodiment, the third CMP 238 is performed at a head rotation speed of about 50 rpm to about 150 rpm and a platen rotation speed of about 50 rpm to about 150 rpm, and under a down force of about 1 psi to about 4 psi and a slurry flow rate of about 100 mL per minute to about 300 mL per minute. In some embodiments, the first slurry 232 comprises $CeO_2$.

Figure 11:
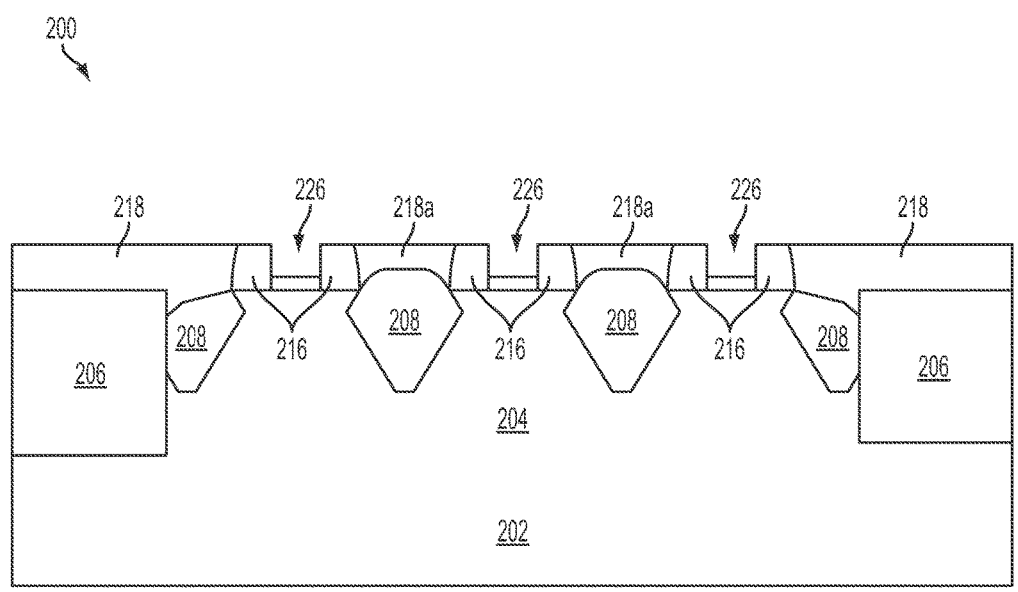

FIG. 11 shows the FET 200 of FIG. 10 after the low-aspect-ratio remaining dummy gate electrode 215 is removed from the dummy gate stack 210 to form a low-aspect-ratio trench 226 in the pair of sidewall spacers 216. The remaining dummy gate electrode 215 may be removed using a wet etch and/or a dry etch process. In at least one embodiment, the wet etch process for dummy poly-silicon gate electrode 215 includes exposure to a hydroxide solution containing ammonium hydroxide, diluted HF, deionized water, and/or other suitable etchant solutions. In other embodiments, the dry etch process for the remaining dummy gate electrode layer 215 may be performed under a source power of about 650 W to about 800 W, a bias power of about 100 W to about 120 W, and a pressure of about 60 mTorr to about 200 mTorr, using $Cl_2$, HBr and He as etching gases.

The low-aspect-ratio trench 226 makes it easier for metal material depositions into the low-aspect-ratio trench 226. Accordingly, the described methods of fabricating a low-aspect-ratio metal gate electrode 224 of the FET 200 (shown in FIG. 12) reduce void generation in the metal gate electrode 224 in the low-aspect-ratio trench 226 and improve device performance.

Figure 12:
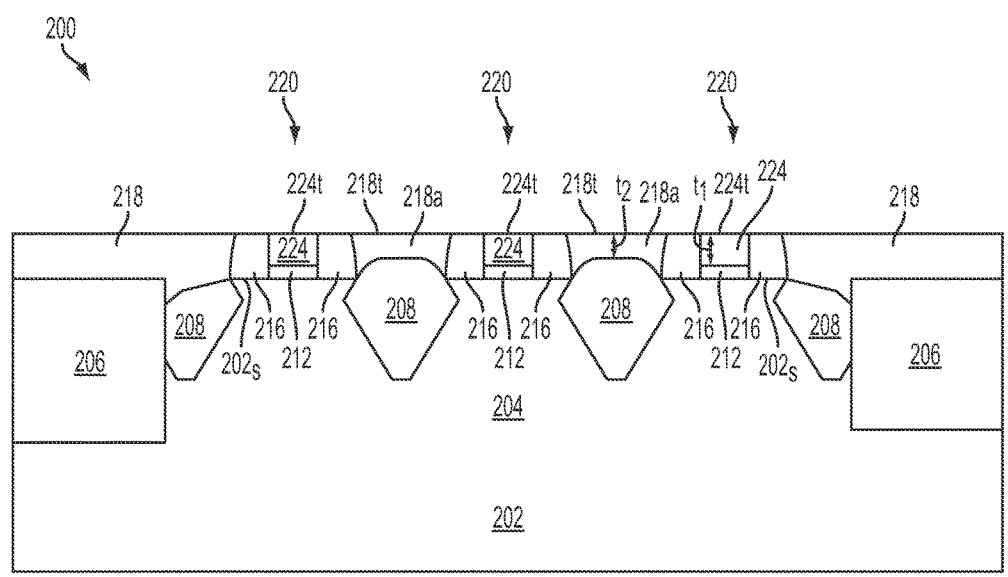

Referring to FIG. 12, subsequent to formation of the low-aspect-ratio trench 226, a metal layer fills the low-aspect-ratio trench 226. For example, the metal layer comprises a P-work-function metal or an N-work-function metal. In some embodiments, the P-work-function metal comprises TiN, WN, TaN, and Ru. In some embodiments, the N-work-function metal comprises Ti, Ag, Al, TiAl, TiAlN, TaC, TaCN, TaSiN, Mn, or Zr. Another CMP is performed on the metal layer to form the metal gate electrode 224 of the FET 200, wherein the CESL 218 is adjacent to the spacer 216 and further comprising a portion 218a extending over the S/D region 208, wherein the portion 218a has the second top surface 218t substantially coplanar with a top surface 224t of the metal gate electrode 224. In some embodiments, an aspect ratio of the metal gate electrode 224 is from about 0.8 to about 1.2. In the depicted embodiment, the metal gate electrode 224 and gate dielectric layer 212 are combined and referred to as a gate stack 220.

If the S/D region 208 extends above the substrate surface 202s, a first thickness $t_1$ of the gate electrode 224 is greater than a second thickness $t_2$ of the portion 218a of the CESL 218 extending over the S/D region 208. In some embodiments, a ratio of the first thickness $t_1$ to the second thickness $t_2$ is from about 1.1 to about 1.5. If the S/D region 208 is below the substrate surface 202s (not shown), a first thickness $t_1$ of the gate electrode 224 is less than a second thickness $t_2$ of the portion 218a of the CESL 218 extending over the S/D region 208. In some embodiments, a ratio of the first thickness $t_1$ to the second thickness $t_2$ is from about 0.5 to about 0.9.

After the steps shown in FIGS. 1-12 have been performed, in some embodiments, subsequent processes, comprising interconnect processing, are performed to complete the FET 200 fabrication.

Figure 14:
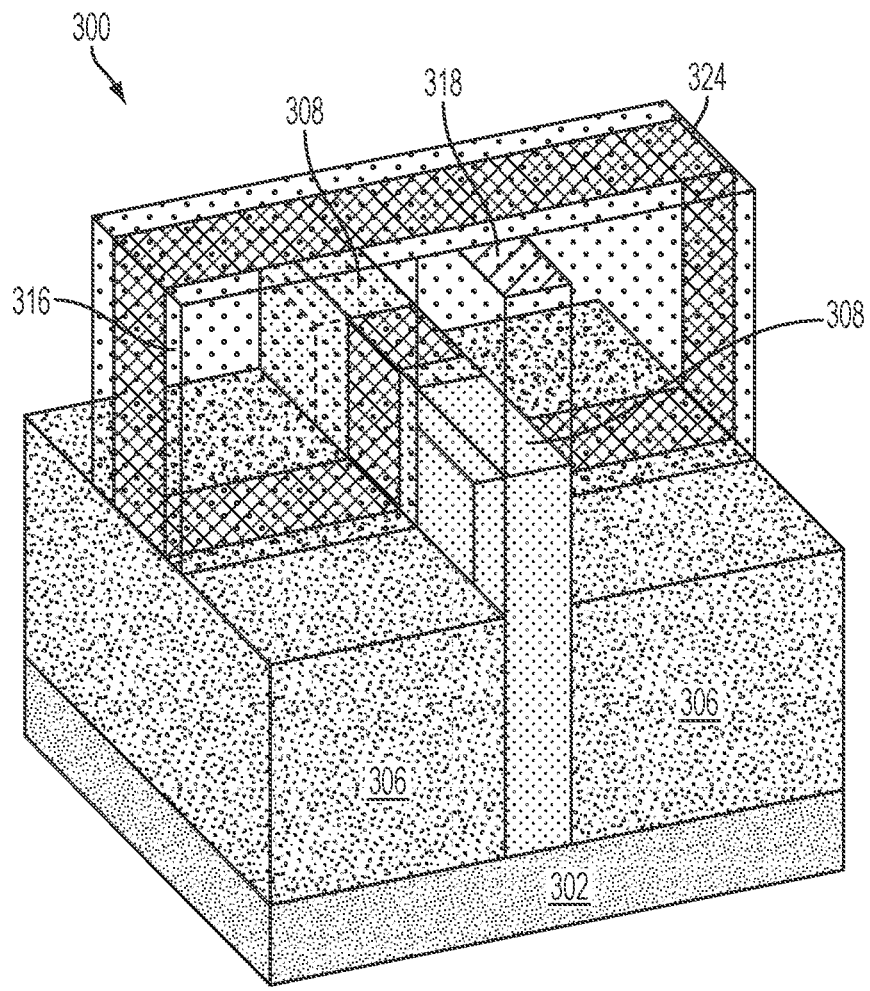
FIG. 14 is a perspective view of a Fin field effect transistor according to various aspects of the present disclosure.

FIG. 14 is a perspective view of Fin field effect transistor 300. FIG. 14 includes Fin field effect transistor similar to field effect transistor 200 as shown in FIG. 12. Similar elements in FIG. 14 have reference numbers increased by 100 over the corresponding elements in FIG. 12.

In accordance with one embodiment, a method of fabricating a field effect transistor includes providing a substrate having a dummy gate electrode having a sidewall, a S/D region, a spacer on the sidewall and positioned between the dummy gate electrode and the S/D region, and an isolation feature; a CESL is deposited over the dummy gate electrode, the S/D region and the spacer and an ILD layer is deposited over the CESL; a first CMP using a first slurry then exposes the CESL over the dummy gate electrode, followed by a second CMP using a second slurry to expose the dummy gate electrode; an upper portion of the CESL and spacer are then removed and a third CMP is performed using the first slurry to expose the CESL over the S/D region with an entire top surface of the CESL over the S/D region and the isolation feature being substantially co-planar with a top surface of the dummy gate electrode.

In accordance with another embodiment, a method of fabricating a field effect transistor includes depositing a CESL over a substrate including a dummy gate electrode having a sidewall, a S/D region, a spacer on the sidewall positioned between the dummy gate electrode and the S/D region, and an isolation feature; depositing an ILD layer over the CESL; performing a first CMP using a first slurry to expose a first upper surface of the CESL and a first upper surface of the ILD; performing a second CMP using a second slurry to expose a first upper surface of the dummy gate electrode, a second upper surface of the CESL and a second upper surface of the ILD; etching an upper portion of the CESL and the spacers to expose a third upper surface of the CESL with the dummy gate electrode and the ILD extending above the exposed third upper surface of the CESL; and performing a third CMP using the first slurry to expose a fourth upper surface of the CESL over the S/D region and a second upper surface of the dummy gate electrode with the entire fourth upper surface of the CESL being substantially co-planar with the second upper surface of the dummy gate electrode.

In accordance with another embodiment, a method of fabricating a field effect transistor includes depositing a CESL over a substrate including a dummy gate electrode having a sidewall, a S/D region, a spacer on the sidewall arranged between the dummy gate electrode and the S/D region, and an isolation feature; depositing an ILD layer over the CESL; performing a first CMP using a first slurry to expose the CESL over the dummy gate electrode; performing a second CMP using a second slurry to expose the dummy gate electrode; removing an upper portion of the CESL and the spacers; performing a third CMP using the first slurry to expose the CESL over the S/D region; removing the dummy gate electrode to form a gate trench; filling the gate trench with a conductive layer; and performing a fourth CMP to remove an upper portion of the conductive layer to form a gate electrode with an entire top surface of the CESL over the S/D regions being substantially co-planar with a top surface of the gate electrode.

While the invention has been described by way of example and in terms of the various embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, the method comprising:
   providing a substrate comprising a dummy gate electrode having a sidewall, a source/drain (S/D) region, a spacer on the sidewall distributed between the dummy gate electrode and the S/D region, and an isolation feature;
   depositing a contact etch stop layer (CESL) over the dummy gate electrode, the S/D region and the spacer;
   depositing an interlayer dielectric (ILD) layer over the CESL;
   performing a first chemical mechanical polishing (CMP) using a first slurry to expose the CESL over the dummy gate electrode;
   performing a second CMP using a second slurry to expose the dummy gate electrode;
   removing an upper portion of the CESL and an upper portion of the spacer; and
   performing a third CMP using the first slurry to expose the CESL over the S/D region, wherein, following the third CMP, an entire top surface of the CESL over the S/D region and over the isolation feature is substantially co-planar with a top surface of the dummy gate electrode.

2. The method of claim 1, wherein the performing of the first CMP comprises using the first slurry comprising $CeO_2$.

3. The method of claim 1, wherein the performing of the second CMP comprises using the second slurry comprising $SiO_2$.

4. The method of claim 1, wherein the removing of the upper portion of the CESL and the upper portion of the spacer is performed using a wet etch.

5. The method of claim 1, wherein the removing of the upper portion of the CESL and the upper portion of the spacer is performed using a dry etch.

6. The method of claim 5, wherein the dry etch is performed under a pressure of about 10 mTorr to about 100 mTorr and under a bias power is about 50 W to about 300 W.

7. The method of claim 1, further comprising:
   removing the dummy gate electrode to form a gate trench; and
   filling the gate trench with a conductive layer.

8. The method of claim 7, further comprising:
   performing a fourth CMP to remove an upper portion of the conductive layer to form a gate electrode, wherein, following the fourth CMP, an entire top surface of the CESL over the S/D region and over the isolation feature is substantially co-planar with a top surface of the gate electrode.

9. The method of claim 7 wherein:
   the filling of the gate trench comprises filling the gate trench with a P-work-function metal or an N-work-function metal.

10. The method of claim 7 wherein:
    the filling of the gate trench comprises filing the gate trench with a P-work-function metal selected from the group consisting of TiN, WN, TaN, Ru, alloys thereof, and mixtures thereof, or
    an N-work-function metal selected from the group consisting of Ti, Ag, Al, TiAl, TiAlN, TaC, TaCN, TaSiN, Mn, Zr, alloys thereof, and mixtures thereof.

11. A method of fabricating a semiconductor device, the method comprising:
    depositing a contact etch stop layer (CESL) over a substrate, the substrate comprising a dummy gate electrode, a source/drain (S/D) region, and an isolation feature, the CESL being deposited over the dummy gate electrode, the S/D region, and the isolation feature;
    depositing an interlayer dielectric (ILD) layer over the CESL;
    performing a first chemical mechanical polishing (CMP) using a first slurry to expose a first upper surface of the CESL and a first upper surface of the ILD;
    performing a second CMP using a second slurry to expose a first upper surface of the dummy gate electrode, a second upper surface of the CESL and a second upper surface of the ILD;
    etching an upper portion of the CESL to expose a third upper surface of the CESL, wherein, after etching, the dummy gate electrode and the ILD extend above the third upper surface of the CESL; and
    performing a third CMP using the first slurry to expose a fourth upper surface of the CESL over the S/D region and a second upper surface of the dummy gate electrode, wherein, following the third CMP, the entire fourth upper surface of the CESL is substantially co-planar with the second upper surface of the dummy gate electrode.

12. The method of claim 11, wherein:
    the performing of the first CMP comprises using the first slurry comprising $CeO_2$ with a CMP head rotation speed of about 50 rpm to about 150 rpm.

13. The method of claim 11, wherein:
    the performing of the second CMP comprises using the second slurry comprising $SiO_2$ with a CMP head rotation speed of about 50 rpm to about 150 rpm and a CMP platen rotation speed of about 50 rpm to about 150 rpm.

14. The method of claim 11, wherein:
    the etching of the upper portion of the CESL is performed using a wet etch solution comprising $H_3PO_4$ applied at an etch temperature of at least 100° C.

15. The method of claim 11, wherein:
the etching of the upper portion of the CESL is performed using a dry etch process using a reaction gas comprising $CH_3F$ applied under a source power of about 300 W to about 1000 W.

16. The method of claim 11, further comprising:
opening an S/D cavity in a first semiconductor material, the first semiconductor material having a first lattice constant; and
filling the S/D cavity with a second semiconductor material having a second lattice constant,
wherein a mismatch between the first lattice constant and the second lattice constant produces a strained S/D region.

17. A method of fabricating a semiconductor device, the method comprising:
depositing a contact etch stop layer (CESL) over a substrate, the substrate comprising a dummy gate electrode, a source/drain (S/D) region, the CESL being deposited over the dummy gate electrode, and the S/D region;
depositing an interlayer dielectric (ILD) layer over the CESL;
performing a first chemical mechanical polishing (CMP) to expose the CESL over the dummy gate electrode;
performing a second CMP to expose the dummy gate electrode;
removing an upper portion of the CESL;
performing a third CMP to expose the CESL over the S/D region;
removing the dummy gate electrode to form a gate trench;
filling the gate trench with a conductive layer; and
performing a fourth CMP to remove an upper portion of the conductive layer to form a gate electrode, wherein, following the fourth CMP, an entire top surface of the CESL over the S/D regions is substantially co-planar with a top surface of the gate electrode.

18. The method of claim 17, wherein:
the performing of the fourth CMP forms the gate electrode having a gate thickness and forms a residual CESL, wherein the residual CESL over the S/D region has a first residual CESL thickness, the gate thickness and the first residual CESL thickness defining a ratio of from about 1.1 to about 1.5.

19. The method of claim 17, wherein:
the removing of the dummy gate is performed using a wet etch, thereby forming the gate trench having an aspect ratio of at least 3.

20. The method of claim 17, wherein:
the removing of the dummy gate is performed using a combination of a wet etch and a dry etch.

* * * * *